United States Patent [19]

Oates et al.

[11] Patent Number: 4,609,890

[45] Date of Patent: Sep. 2, 1986

[54] BULK ACOUSTIC WAVE SIGNAL PROCESSING DEVICES

[76] Inventors: Daniel E. Oates, 302 Payson Rd., Belmont, Mass. 02178; Peter V. Wright, 5902 Preston Oaks Rd. Apt. 1040, Dallas, Tex. 75240

[21] Appl. No.: 666,044

[22] Filed: Oct. 29, 1984

[51] Int. Cl.$^4$ .......................... H03H 9/54; H03H 9/15; H03H 9/24

[52] U.S. Cl. ..................... 333/187; 333/141; 333/145; 333/147; 333/188; 310/335; 350/3.6

[58] Field of Search ............... 333/141–145, 333/147, 149, 187–189; 310/311, 320, 321, 323, 357–359, 335, 368; 350/3.6, 3.61, 3.64, 3.65, 3.68, 3.86, 358, 162.21; 364/821, 822

[56] References Cited

U.S. PATENT DOCUMENTS 3,840,826 10/1974 Toda et al. ........................ 333/144
4,117,424 9/1978 Coldren et al. ................ 333/144 X
4,169,236 9/1979 Epstein ............................ 333/193

OTHER PUBLICATIONS

Alig–"Acoustic Diffraction and the Electrostrictive Transducer", Journal of Applied Physics, vol. 46, No. 9, Sep. 1975; pp. 3731-3737.

*Primary Examiner*—Marvin L. Nussbaum
*Attorney, Agent, or Firm*—Robert F. O'Connell

[57] ABSTRACT

An acoustic wave signal processing device which in a preferred embodiment utilizes at least one holographic grating formed within a portion of the interior of a substrate which is capable of supporting the propagation of bulk acoustic wave signals therein. The grating provides spatially varying acoustic impedances within the substrate and interacts with bulk acoustic wave signals propagated therethrough so as to produce output acoustic wave signals. The grating and transducers for producing and receiving the input and output bulk acoustic wave signals, respectively, can be arranged to provide a variety of signal processing operations which may be desired, such as providing resonating operations and filter operations, for example.

23 Claims, 7 Drawing Figures

BULK ACOUSTIC WAVE SIGNAL PROCESSING DEVICES

INTRODUCTION

The Government has rights in this invention pursuant to Contract Number F19628-80-C-0002 awarded by the Department of the Air Force.

This invention relates generally to high frequency signal processing devices and, more particularly, to devices which utilize bulk acoustic waves in a crystal substrate for providing such processing.

BACKGROUND OF THE INVENTION

Various devices have been proposed for processing of signals at very high frequencies. One such device is a surface acoustic wave (SAW) device which has found widespread application for performing analog signal processing functions, such as filtering, correlation, convolution, and pulse compression operations. Such devices tend to be relatively simple and inexpensive to fabricate and have the advantages of being both passive in nature and extremely compact in structure. Exemplary devices have been described in the literature and a typical device is described, for example, in U.S. Pat. No. 4,101,965, issued on July 18, 1978 to K. Ingebrigtsen et al.

Because of the low velocity of surface acoustic waves along the surface of a crystal substrate, relatively long interaction times can be accommodated on a relatively short substrate. Bandwidths of up to about 200 Megahertz (MHz), or so, can be achieved. Such bandwidth and interaction time characteristics make SAW devices highly useful as signal processing devices. However, the fractional bandwidths of surface acoustic wave devices is fixed at about 20% and, therefore, to achieve wider bandwidths the center frequency has to be increased. But the center frequency of an SAW device has a practical upper limit of about 1 GHz. Thus, as mentioned above, the bandwidth is limited to about 200 MHz. Such upper frequency limit tends to arise because of the increasing dispersion of the acoustic wave as it travels along the surface, which dispersion can often be attributable to surface damage and because of the increasing attenuation of the surface acoustic wave due to the substrate material which attenuation generally tends to increase as the square of the frequency. Further, there are limitations in the processes, normally photolithographic processes, for fabricating the surface gratings and the transducers associated therewith, the dimensions thereof becoming so small at extremely high frequencies that the processes used are not capable of providing the required small dimensions.

In order to overcome the frequency limitations on surface acoustic waves, the use of microwave superconducting strip transmission line devices has been suggested. Such approach is discussed, for example, in the article "Passive Superconducting Microwave Circuits For 2-20 GHz Bandwidth Analog Signal Processing" by J. T. Lynch et al., Proceeding of the MTT Symposium, 1982. Such devices, however, require operation at extremely low temperatures (down to as low as about 4° K.), thus requiring a multi-stage refrigeration system which substantially increases the weight and volume of the overall device and requires power for operating the refrigeration system. Moreover, there is a time delay in achieving signal processing operation after the refrigeration system has been made operative. Furthermore, such approach is relatively costly and, because the fabrication of such superconducting strip lines is extremely difficult in comparison with the fabrication of surface acoustic wave devices, they are even more subject to manufacturing defects. Since superconducting strip transmission lines are utilized with electromagnetic waves, the high velocity of such waves severely reduces the interaction time that can be achieved.

Accordingly, it would be desirable to devise an approach that would achieve the high frequency operation required without the disadvantages of either the surface acoustic wave device approach or the microwave superconducting strip transmission approach, at a reasonable cost and with a reasonable ease of fabrication.

BRIEF SUMMARY OF THE INVENTION

In accordance with the invention a bulk acoustic wave (BAW) signal is utilized in a crystal substrate which can support the transmission thereof through its interior rather than at the surface of the substrate. A portion of the interior of the substrate is suitably processed so as to provide a plurality of regions which have periodically varying acoustic impedance characteristics so that a bulk acoustic wave signal transmitted therethrough interacts with such regions, such as by reflection, so as to provide the desired signal processing characteristics for the bulk acoustic wave. Since the acoustic impedance is effectively proportional both to the density of the substrate material and to the velocity of the acoustic wave, the interaction can be arranged so as to be effectively imparted to the acoustic wave either in terms of periodically variable density values, periodically variable velocity values, or both.

In a specific embodiment of the invention, for example, a grating, such as a holographic grating also known as a bulk phase hologram, is formed in the interior portion of the substrate in a manner such that a plurality of regions formed thereby are periodically spaced with respect to each other, periodicity thereof being either constant or variable, as desired. Such periodically spaced regions are arranged to provide periodically varying acoustic impedances. The bulk acoustic wave appropriately interacts with the interior holographic grating, which acts as an acoustically reflective grating, so as to provide a desired processing effect, such as producing a resonating, or oscillation effect, a filter operation, or other processing operations which include, but are not necessarily limited to the types of signal processing operations previously provided by surface acoustic wave devices.

DESCRIPTION OF THE INVENTION

The invention can be described in more detail with the help of the accompanying drawings wherein FIG. 1 shows one specific embodiment of the invention utilizing a holographic grating within a crystal substrate for interacting with a bulk acoustic wave propagated through the interior of the substrate;

Figure 1:
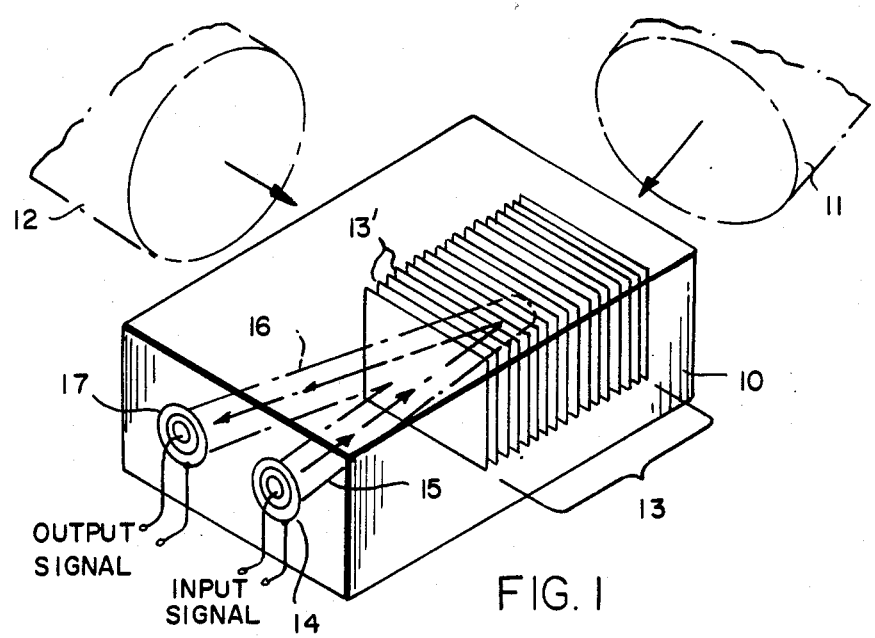

As can be seen in FIG. 1, a crystal substrate 10 which may be, for example, a lithium niobate (LiNbO$_3$) crystal material is initially processed by utilizing two interfering coherent light beams 11 and 12, as from suitable laser sources (not shown), which are directed toward the interior of the crystal. Such operation provides a holographic optical image, designated by reference numeral 13, within the interior region of the substrate which produces an effective holographic grating in which a plurality of regions 13' having spatially varying characteristics are formed, i.e., the regions are periodically spaced along one direction of the crystal substrate. In the particular embodiment shown, the spatial periodicity is essentially constant although as discussed below, in some embodiments it may be desirable to make the period, and hence the spacings, thereof variable. The formation of holographic images of the type shown is within the skill of the art and, in fact, has been disclosed for an entirely different purpose in the article "Time-dependent Characteristics of Photo-induced Space-charge Fields and Holograms In Lithium Niobate and the Photorefractive Media", G. A. Alphonse et al., RCA Review 36, pages 213-229, 1975.

In accordance with the invention it has been discovered that the regions 13' have periodically varying acoustic impedance characteristics which produce an interaction with an acoustic wave directed therethrough. In the case of a holographically formed grating, the density of the substrate material changes in a periodic fashion from region to region and the velocity of the interacting acoustic wave, as discussed in more detail below, also changes periodically as it is transmitted through the crystal substrate.

A launching, or input, transducer 14 is appropriately positioned at one end of the crystal substrate 10, such transducer being in the form, for example, of a deposited film of piezoelectric materials as, for example, zinc oxide (ZnO) having suitable metallic electrodes associated therewith to which are attached a pair of wires which are used to supply an input signal to be processed, as shown and as would be well known to those in the art. Alternatively, the piezoelectric transducer could be formed so as to be bonded to the substrate surface. The input signal supplied to transducer 14 causes a bulk acoustic wave 15 to be propagated through the interior of the crystal structure, as shown by the arrows, to the holographic grating 13. The direction of propagation is shown as being at an angle with respect to the surface of the transducer and to the planes of the regions 13' for illustration purposes only of the principles of operation The direction of propagation can be set up to have normal incidence to the regions 13' or to have oblique incidence thereto as desired and as discussed below.

The acoustic wave signal interacts with the grating regions and because of the reflective characteristics thereof provides a reflected acoustic wave 16 to an output transducer 17, fabricated in substantially the same manner as input transducer 14, which converts the acoustic wave signal to an electrical signal for supply as an output signal at the pair of wires connected to the electrodes thereof.

The periodically varying acoustic impedance characteristics at the regions 13' of holographic grating 13 are caused by the interference pattern which is formed when the interfering coherent light beams 11 and 12 are applied to the crystal, as discussed above. The interference pattern, for example, produces patterns of alternating light (where the beams reinforce) and dark (where the beams cancel) regions so that electrons present within the substrate in the high light intensity regions tend to migrate to the regions of lower or dark optical intensity. The lithium niobate substrate is preferably doped by metallic impurities, such as iron, which act to supply electrons in the regions of higher optical intensity and to trap electrons in the regions of lower optical intensity. After some time, the light may be removed and the charge pattern remains stored within the substrate. Accordingly, the alternating optical intensity causes a corresponding charge pattern to be stored in the crystal.

It has been discovered that the high light intensity (low charge) and low light intensity (high charge) regions that are so formed can interact with a bulk acoustic wave propagated therethrough because of the effect on the acoustic properties of the material, i.e., by providing in the particular embodiment described periodically varying material density values and periodically varying acoustic velocity values.

There are other substrate materials that can be used, such as barium titinate (BaTiO$_3$) and strontium barium niobate (Sr$_x$Ba$_{1-x}$Nb$_2$O$_6$), in which the holographic electric charge pattern can be used to induce ferroelectric domain reversals in the places where the stored electric field, together with an applied field, exceeds the coercive field of the material. In this case the interaction with the bulk acoustic wave is caused by the variations of the acoustic impedance associated with ferroelectric domain reversals. Such approach to fixing a holographic grating in these materials is described, for example, in the article "Ferroelectric Crystals" by D. L. Staebler, published in Topics in Applied Physics, Volume 20, Springer Verlag, 1977, at page 101.

It has been found that such holographic grating then can be utilized for bulk acoustic waves in much the same way that a surface acoustic wave device having a mechanically formed surface grating can be used. In the case of the invention, however, the disadvantages of using surface formed transducers and gratings and surface acoustic waves can be avoided and the use of internally generated holographic gratings should permit operation at frequencies much higher than 1 GHz and up to as high as 5 GHz, or more, and such gratings should not be subject to the contamination problems which occur in surface acoustic wave devices which are exposed to the environment.

The device shown in FIG. 1 illustrates how an acoustic wave signal can be generated for propagation through the interior of a substrate to such a holographic grating for interaction therewith and subsequently out from the interior of the substrate. It has been found that while such acoustic wave can be of either a longitudinal or a transverse type, a longitudinal wave which is propagated along the Z direction of the crystal appears to provide an effective acoustic interaction. The holographic grating can be formed in various orientations depending on how the interfering beams 11 and 12 are directed at the material. This device with one or more phased array transducers known to the art performs a bandpass filter function. FIGS. 2–7 show diagrammatically various other devices for providing various signal processing operations depending on the orientation of the holographic grating and on the placement of the launching and receiving transducers.

Figure 2:
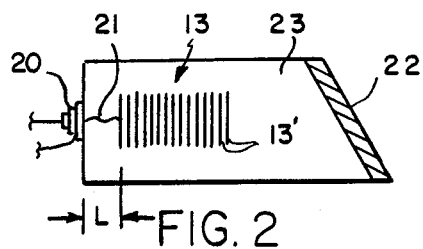
FIG. 2 shows a diagrammatic side view of an alternative embodiment of the invention for providing a one port resonating device.

FIG. 2, for example, shows a grating 13 within a crystal substrate 23 which grating is oriented in much the same manner as shown in FIG. 1. A single transducer 20 is utilized for propagating a bulk acoustic wave 21 along the longitudinal axis of the grating. The separation L between the transducer 20 and the initial interface region at the grating generally determines the length of the resonant cavity of the device so that the device can be utilized as a resonator, or oscillator. In such a case a single transducer is utilized, the grating has a constant period (i.e., a constant distance or spacing between regions 13'), and the acoustic wave incidence is normal to the grating interface. The frequency $F_o$ of such an oscillator is approximately equal to $v_a/2l$, where $v_a$ is the linear velocity of the bulk acoustic wave and $l$ is the grating period. The distance L is chosen so that the resonant frequency of the cavity corresponds to the maximum reflection frequency of the grating. Appropriate acoustic absorbent material 22 is utilized at the end surface of the crystal substrate which is opposite that of the location of transducer 21, one such surface being formed at an angle with reference to the direction of propagation as shown.

Figure 3:
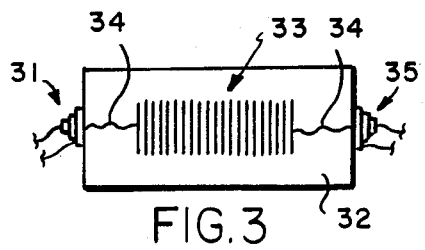
FIG. 3 shows a diagrammatic side view of another alternative embodiment of the invention for providing a filter operation.

FIG. 3 shows a configuration for providing a stop band filtering operation. In accordance therewith, an input transducer 31 is utilized at one end of a crystal substrate 32 having a suitable holographic grating 33 formed in the interior thereof in an orientation such as to be normal to the incidence of propagation of a bulk acoustic wave 34. The acoustic wave which propagates through grating 32 is transmitted to an output transducer 35 for providing an output signal therefrom. The processing performed by the interaction of the grating 33 with the acoustic wave produces a bandstop filter response, the bandwidth thereof being controlled by controlling the amplitude weighting of the grating. Such weighting may be controllably arranged during the writing of the holographic grating or by selective partial erasure after writing by utilizing a suitable laser beam in a manner which would be known to those in the art.

Figure 6:
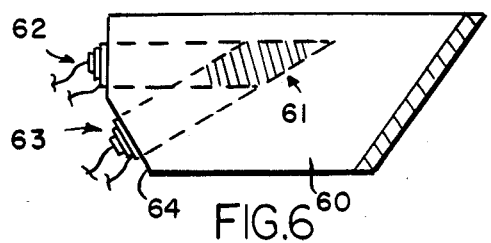
FIG. 6 shows a diagrammatic side view of an alternative embodiment of the invention for providing the filter operations of FIGS. 4 and and 5.
Figure 4:
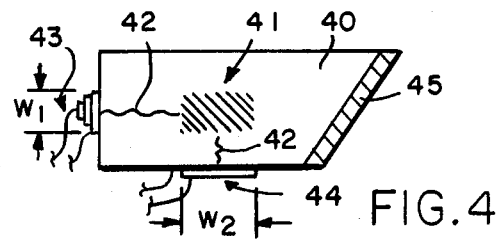
FIG. 4 shows a diagrammatic side view of another alternative embodiment of the invention for providing a different filter operation.
Figure 5:
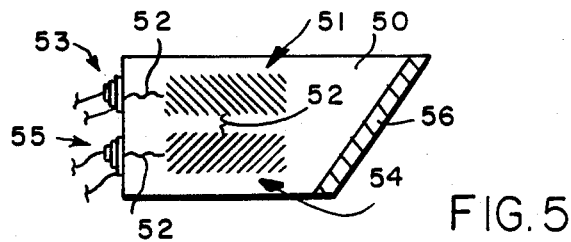
FIG. 5 shows a diagrammatic side view of still another alternative embodiment of the invention for providing a further filter operation.

FIGS. 4–6 show various ways of providing a signal processing device in accordance with the invention for producing bandpass filter operations. FIG. 4 for example shows a substrate 40 having a holographic grating 41 formed therein at an orientation which is effectively at an angle of 45° with reference to the direction of propagation of an acoustic wave 42 lauched by an input transducer 43. The propagation path for the acoustic wave is thus in an L-shaped form and the output of the device is supplied at an output transducer 44. Appropriate acoustic absorbent material 45 is utilized at the end of the crystal substrate opposite to that at which the input transducer is located. The grating 41 is arranged to have a constant period but an oblique incidence, as shown. In such a configuration the product of the transducer widths $W_1$, $W_2$ is arranged to be substantially equal to the area of the grating, the length and width of the grating being controlled to provide the desired bandpass response. Accordingly, in such configuration the widths of the two transducers cannot be independently chosen in order to satisfy diffraction and electrical matching requirements. While the periodicity of the grating regions is substantially constant, it would be clear to those in the art that such spacings can be made to vary in a desired manner so as to provide for acoustic wave signal compression or expansion in order to produce a "chirp" filter operation, for example, analogously to the manner in which such filter operation has been achieved with surface acoustic wave devices. Although the connfiguration of FIG. 4 can find use in many applications, an alternative embodiment may be useful in other applications.

One such alternative embodiment is shown in FIG. 5 which utilizes an effective U-path configuration for the bulk acoustic wave signal. In accordance therewith a substrate 50 has a first holographic grating 51 formed in the interior therein at oblique incidence to an input bulk acoustic wave 52 generated and launched into the interior from an input transducer 53. A second holographic grating 54 is formed below the first one at an oblique incidence which has a 90° orientation from that of grating 51 and provides an output acoustic wave signal at output transducer 55. The widths of transducers 53 and 55 may be appropriately selected independently to satisfy diffraction and electrical matching requirements although the U-path configuration results in greater complexity than that of FIG. 4. Appropriate acoustic absorbent material 56 is utilized in the same manner as in FIG. 4. In the configurations of FIG. 5 it would be expected that the insertion loss of the bulk acoustic wave would be greater than that which results when utilizing a single holographic grating. As mentioned above with reference to FIG. 4, the spacings between the regions of the grating can be varied so as to provide a chirp filter operation.

A further alternative embodiment utilizing a single grating configuration for a bandpass filter operation is shown in FIG. 6 wherein a substrate 60 has a holographic grating 61 formed at an incident angle intermediate that of the gratings formed, for example, in FIGS. 4 and 5. The input bulk acoustic wave transducers 62 and the output bulk acoustic wave transducer 63 are placed at a suitable small angle relative to each other, rather than at 90° as in FIG. 4, by mounting the output transducer at a bevelled surface 64 that is cut and polished at a selected angle with respect to the surface on which input transducer 62 is mounted. The separation of the two transducers in this manner also assures better isolation between them than the configuration of FIG. 5 wherein the input and output transducers are on the same surface substantially adjacent each other. An advantage of the configuration of FIG. 6 is that the holographic grating 61 does not have to occupy the full area of overlap between the acoustic wave signal beams directed from and towards the input and output transducers, respectively. Thus the width of each of the transducers and the grating dimensions can be controlled and set in an optimum fashion independently of each other.

Figure 7:
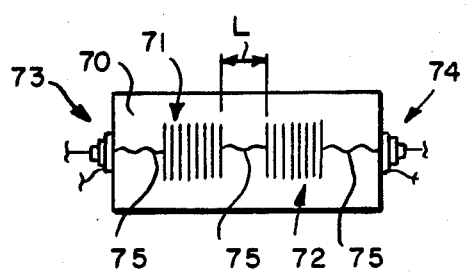
FIG. 7 shows a diagrammatic side view of still another alternative embodiment of the invention for providing a two port resonating device.

A further alternative embodiment for providing resonating operation is shown in FIG. 7 which depicts a two port resonator device. As seen therein, substrate 70 has a pair of in-line holographic gratings 71 and 72 created therein separated by L, where L determines the resonant cavity length. The frequency $F_o$ is approximately equal to $v_a/2l$, where l is the grating period in both gratings. The distance L is chosen so that the resonant frequency of the cavity corresponds to the maximum reflection frequency of the gratings. An input bulk acoustic wave transducer 73 is placed at one end surface thereof and an output bulk acoustic wave transducer 74 is placed at the end surface end surface opposite to that on which transducer 73 is placed. The gratings 71 and 72 are preferably arranged to have normal incidences to the direction of propagation of the bulk acoustic wave signal 75 which interacts with them, as shown.

While the holographic gratings shown in FIGS. 1-7 generally have constant periodicity and acoustic characteristics which vary in a regular manner, it is possible to form such holographic gratings so as to have variable spacings between the regions and to have variable intensity (amplitude) characteristics among the regions. Such variable grating characteristics in effect correspond to variable phase and amplitude characteristics for the filters involved so that filter operations can be controlled to provide whatever types of filtering may be required for the applications desired.

It would be understood by those in the art that, once the holographic grating is formed, the grating remains formed within the interior of the substrate unless it is subjected to erasure by light or heat. In some cases such erasure may occur if the device is exposed to ambient light. However, so long as the device is kept in a light-tight package the hologram will remain intact. Moreover, it is possible to form the hologram using coherent light beams at a particular frequency (e.g., blue light) and to operate the device only in an ambient light atmosphere which does not include such frequency (e.g., a yellow light environment) without destroying the holographic grating. Other techniques are also available to those in the art in order to "fix" or make permanent the holographic grating so that the grating is, in effect, light independent.

The device of the invention increases the upper frequency limit of operation to as high as 5 GHz, or more, and the holographic grating is not subject to the kinds of environmental contamination and mechanical fabrication defects such as would occur with surface acoustic wave grating devices. Moreover, the propagation losses of the bulk acoustic wave signals are minimized when using an interiorly generated and propagated wave rather than a wave generated on the surface of a substrate.

As mentioned above, materials other than Fe-doped $LiNbO_3$ can be utilized for the substrate and any material which is capable of supporting the propagation of both acoustic wave signals within its interior, in which a holographic grating can be formed, and which has properties which permit the interaction of a bulk acoustic wave signal with such holographic grating can be utilized. Other suitable materials in which the interaction occurs in substantially the same manner as in Fe-doped $LiNbO_3$ would include, for example, Fe-doped lithium tantalate ($LiTaO_3$). Further, as already discussed above, Fe-doped barium titinate ($BaTiO_3$), and Cesium-doped strontium barium niobate ($Sr_xBa_{1-x}Nb_2O_6$) represent still other materials for providing the interaction in a different manner. Other materials may also be known or discovered by those in the art which would be useful for devices in accordance with the invention. Other known techniques for controlling the direction of propagation of the bulk acoustic wave signal, such as the use of phased array transducers, also mentioned above, are available to the art for use in the invention. Further, while the embodiments described above are generally shown as forming grating regions which are substantially planar, it would be possible for some applications to be formed as non-planar regions, if desired.

Accordingly, while the specific configurations shown and described herein represent presently preferred embodiments of the invention, other modifications thereto may occur to those in the art within the spirit and scope thereof and, hence, the invention is not to be construed as limited to the specific embodiments shown and discussed above except as defined by the appended claims.

What is claimed is:

1. An acoustic wave signal processing device comprising
   a crystal substrate capable of having bulk acoustic wave signals propagated through the interior thereof;
   transducer means mounted on at least one selected surface of said crystal substrate for producing and receiving bulk acoustic wave signals which are propagated through the interior of said crystal substrate; and
   a portion of the interior of said substrate having a plurality of generally spatially periodic regions formed therein said regions being formed so that the acoustic impedance characteristics of said regions vary spatially in a periodic fashion from region to region such that a bulk acoustic wave signal transmitted through said regions interacts differently with each of said regions during its transmission through said regions.

2. An acoustic wave signal processing device in accordance with claim 1 wherein the densities of said regions vary spatially from region to region.

3. An acoustic wave signal processing device in accordance with claim 1 wherein said regions interact with said bulk acoustic wave signals so that the velocities of said bulk acoustic wave signals vary from region to region.

4. An acoustic wave signal processing device in accordance with claim 1 where the densities of said regions spatially vary from region to region, said regions thereby interacting with said bulk acoustic wave signals so that the velocities of said signals vary from region to region.

5. An acoustic wave signal processing device in accordance with claim 1 wherein said substrate material is Fe-doped $LiNbO_3$.

6. An acoustic wave signal processing device in accordance with claim 1 wherein said substrate is Fe-doped $LiTaO_3$.

7. An acoustic wave signal processing device in accordance with claim 1 wherein said substrate is Fe-doped $BaTiO_3$.

8. An acoustic wave signal processing device in accordance with claim 1 wherein said substrate is Ce-doped $Sr_xBa_{1-x}Nb_2O_6$.

9. An acoustic wave signal processing device in accordance with claim 1 wherein said regions are created by a holographic grating.

10. An acoustic wave signal processing device in accordance with claim 9 wherein said regions are spaced at fixed distances from each other.

11. An acoustic wave signal processing device in accordance with claim 9 wherein said regions are spaced at unequal distances from each other.

12. An acoustic wave signal processing device in accordance with claim 11 where said unequal spacings are selected so as to provide for acoustic wave signal compression or expansion.

13. An acoustic wave signal processing device in accordance with claim 9 wherein said regions have uniform amplitude acoustic impedance variations.

14. An acoustic wave signal processing device in accordance with claim 9 wherein said regions have spatially varying acoustic impedances which have varying amplitude values.

15. An acoustic wave signal processing device in accordance with claim 9 wherein the regions of said holographic grating have a normal incidence to the direction of propagation of said bulk acoustic wave signals.

16. An acoustic wave signal processing device in accordance with claim 15 wherein said device uses a single transducer means for producing and receiving said bulk acoustic wave signals, said bulk acoustic wave signals being reflected from said holographic grating for producing a resonating acoustic wave signal.

17. An acoustic wave signal processing device in accordance with claim 9 wherein the regions formed by said holographic grating have an oblique incidence to the direction of propagation of said bulk acoustic wave signals and further wherein said transducer means includes input transducer means mounted on a first surface of said substrate for producing bulk acoustic wave signals and output transducer means mounted on a second surface of said substrate and responsive to bulk acoustic wave signals interacting with said holographic grating so as to provide an L-shaped propagation path for said bulk acoustic wave signals, whereby said device acts as a bandpass filter.

18. An acoustic wave signal processing device in accordance with claim 9 wherein a pair of holographic gratings are formed in said substrate, the regions of said gratings having an oblique incidence to the direction of propagation of said acoustic eave signals, the oblique incidences of said gratings being arranged at 90° with respect to each other and further wherein said transducer means includes input transducer means and output transducer means, said output transducer means being mounted on the same surface of said substrate as said input transducer means so as to provide a U-shaped path of propagation through said pair of holographic gratings from said input transducer means to said output transducer means, whereby said device operates as a bandpass filter.

19. An acoustic wave signal processing device in accordance with claim 9 wherein the regions of said holographic grating having an oblique incidence to the direction of propagation of said bulk acoustic eave signals and further wherein said transducer means includes input and output transducer means, said output transducer means responsive to the bulk acoustic wave signals after interaction with said holographic grating for providing an output signal, said input transducer means which provide said bulk acoustic wave signals is mounted on a first surface of said substrate and said output transducer means is mounted on a second surface of said substrate which is at a selected angle relative to said first surface, the region of said holographic grating also having an oblique incidence to the direction of propagation of said bulk acoustic waves toward said output means.

20. An acoustic wave signal processing device in accordance with claim 9 wherein
said holographic grating comprises a pair of said holographic gratings positioned along a selected direction in said substrate and separated by a selected distance;
said transducer means for producing and receiving said bulk acoustic wave signals comprises
a first input transducer means positioned at a first selected surface of said substrate for providing a bulk acoustic wave signal for propagation along said selected direction, said bulk acoustic wave signal interacting with said pair of holographic gratings; and
a second transducer means positioned at a second selected surface of said substrate which is opposite to said first selected surface for receiving said propagated bulk acoustic wave signal after it has interacted with said pair of holographic gratings;
said device thereby providing a two port resonating acoustic wave signal.

21. An acoustic wave signal processing device in accordance with claim 1 wherein said transducer means is a piezoelectric film deposited on a selected surface of said substrate.

22. An acoustic wave signal processing device in accordance with claim 1 wherein said transducer means is a piezoelectric material bonded to a selected surface of said substrate.

23. An acoustic wave signal processing device in accordance with claim 1 wherein said transducer means includes a first transducer means which is mounted on one end of said substrate for supplying said bulk acoustic wave signals to said substrate and further including a second transducer means which is mounted on the opposite end of said substrate and responsive to the bulk acoustic wave signals supplied from said region for producing an output signal, whereby said device acts as a bandstop filter.

* * * * *